(12) United States Patent
Liu et al.

(10) Patent No.: US 8,850,366 B2
(45) Date of Patent: Sep. 30, 2014

(54) METHOD FOR MAKING A MASK BY FORMING A PHASE BAR IN AN INTEGRATED CIRCUIT DESIGN LAYOUT

(75) Inventors: Ru-Gun Liu, Zhubei (TW); Shuo-Yen Chou, Ji-an Shiang (TW); Hoi-Tou Ng, Hsinchu (TW); Ken-Hsien Hsieh, Taipei (TW); Yi-Yin Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/564,019

(22) Filed: Aug. 1, 2012

(65) Prior Publication Data
US 2014/0040838 A1    Feb. 6, 2014

(51) Int. Cl.
    *G06F 17/50*    (2006.01)
(52) U.S. Cl.
    USPC .................... 716/53; 716/50; 716/54; 716/55

(58) Field of Classification Search
None
See application file for complete search history.

(56) References Cited

U.S. PATENT DOCUMENTS

| 5,447,810 | A | * | 9/1995 | Chen et al. | ........................ 430/5 |
| 5,663,893 | A | * | 9/1997 | Wampler et al. | ................ 716/52 |

* cited by examiner

*Primary Examiner* — A. M. Thompson
(74) *Attorney, Agent, or Firm* — Haynes and Boone, LLP

(57) ABSTRACT

A method for making a mask for an integrated circuit (IC) design includes receiving an IC design layout having a plurality IC features and performing a targeted-feature-surrounding (TFS) checking operation to identify a targeted-feature-surrounding-location (TFSL) in the IC design layout. The method also includes inserting a phase-bar (PB) to the TFSL, performing an optical proximity correction (OPC) to the IC design layout having the PB to form a modified IC design layout and providing the modified IC design layout for fabrication of the mask.

20 Claims, 8 Drawing Sheets

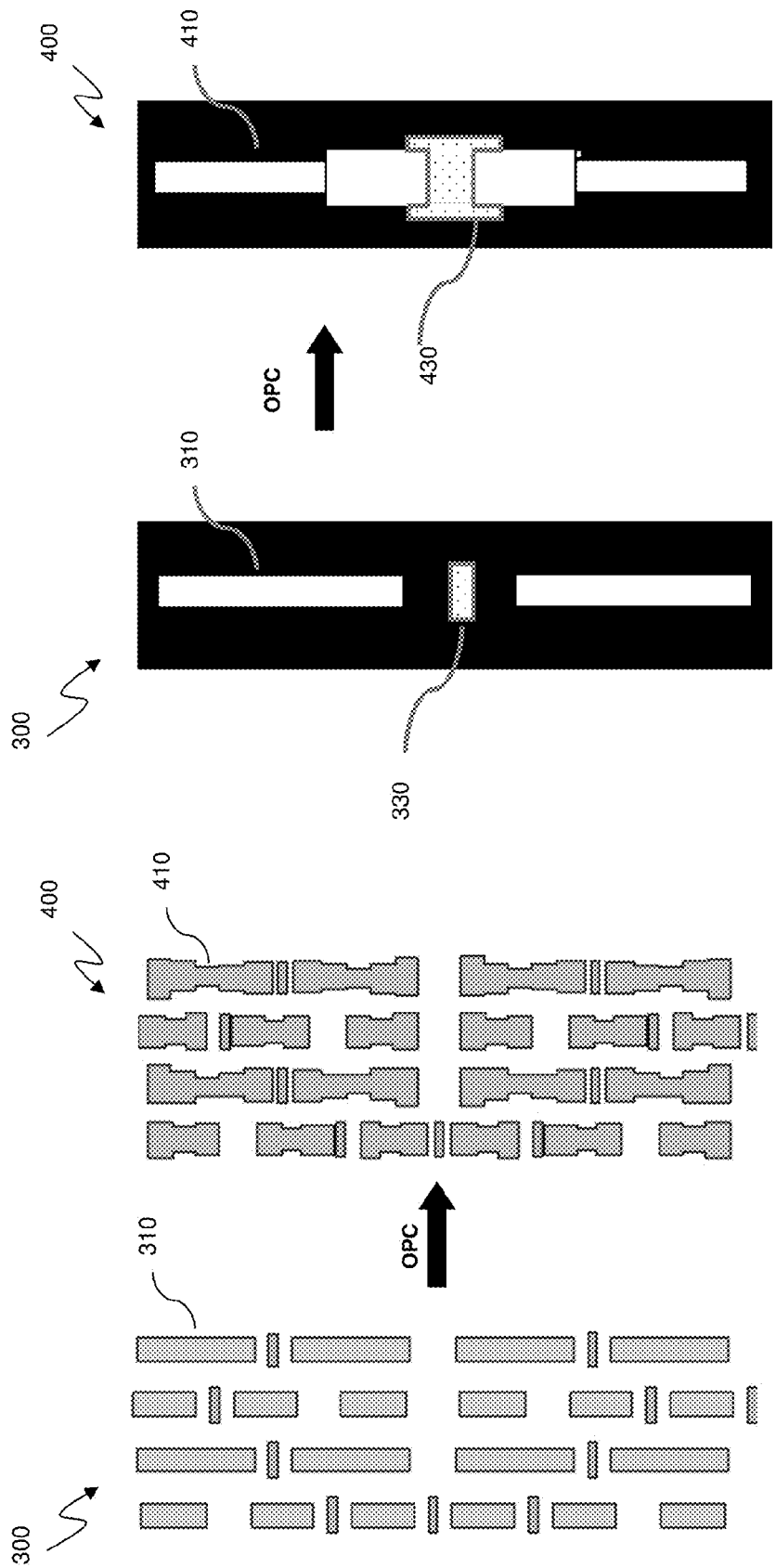

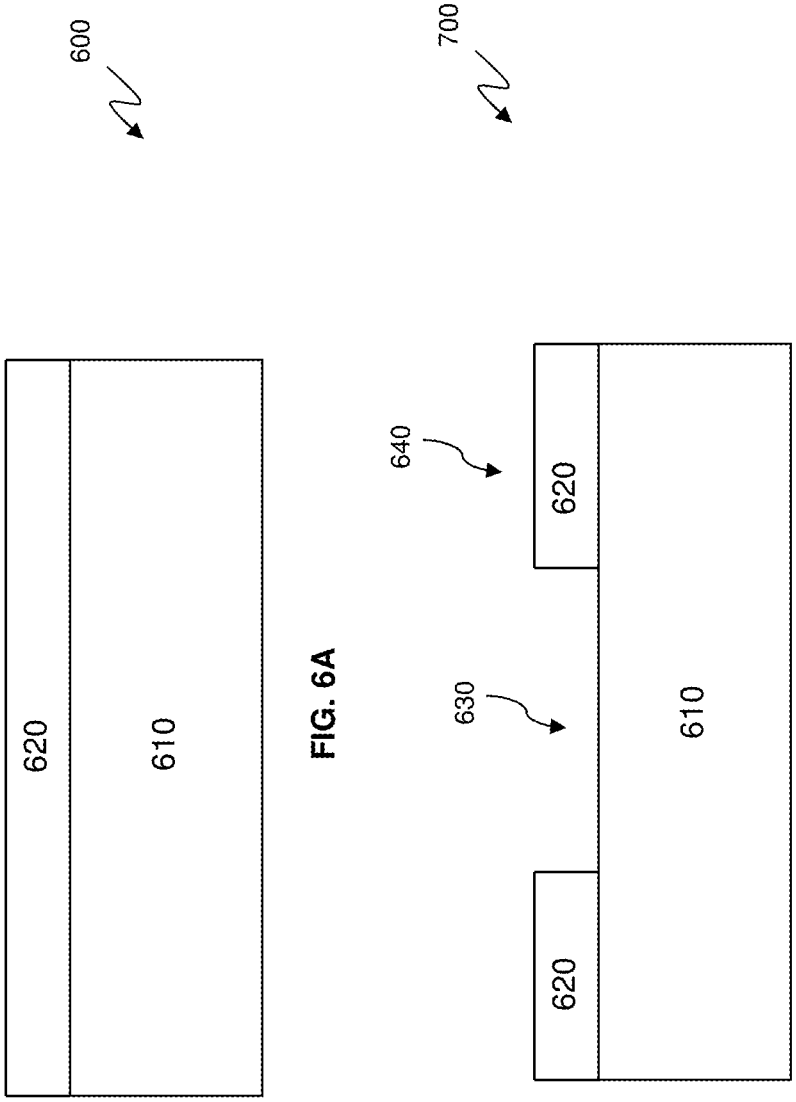

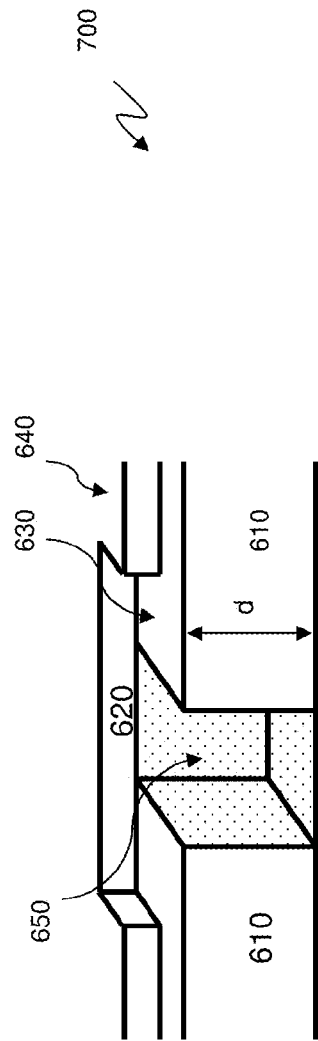
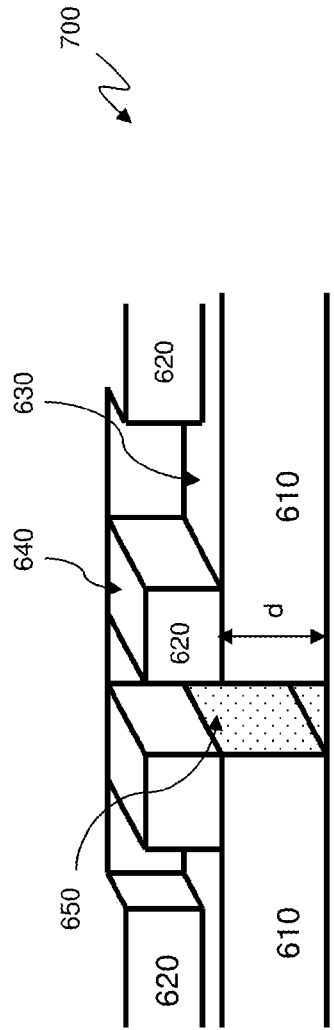
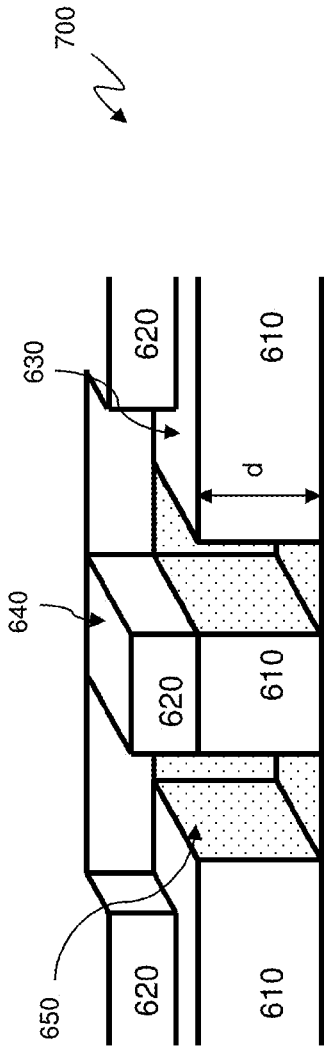

METHOD FOR MAKING A MASK BY FORMING A PHASE BAR IN AN INTEGRATED CIRCUIT DESIGN LAYOUT

BACKGROUND

The semiconductor integrated circuit (IC) industry has experienced exponential growth. Technological advances in IC design and material have produced generations of ICs where each generation has scaled down to smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. For example optical proximity correction (OPC) technique is implemented in a mask fabrication. OPC employs a lithographic model to predict contours of the patterns after the lithography process. A resolution limitation in lithography introduces image distortion in a form of line-end and results in a failure of pattern fidelity correction. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3C and FIGS. 4A-4B are schematic views of an IC design layout at various design stages and constructed according to aspects of the present disclosure.

FIGS. 6A and 6B are cross-sectional views of one embodiment in various stages for fabricating a photomask according to various aspects of the present disclosure.

FIGS. 7A-7C and FIGS. 8A-8C are schematic views of forming a phase-bar in a photomask constructed according to aspects of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
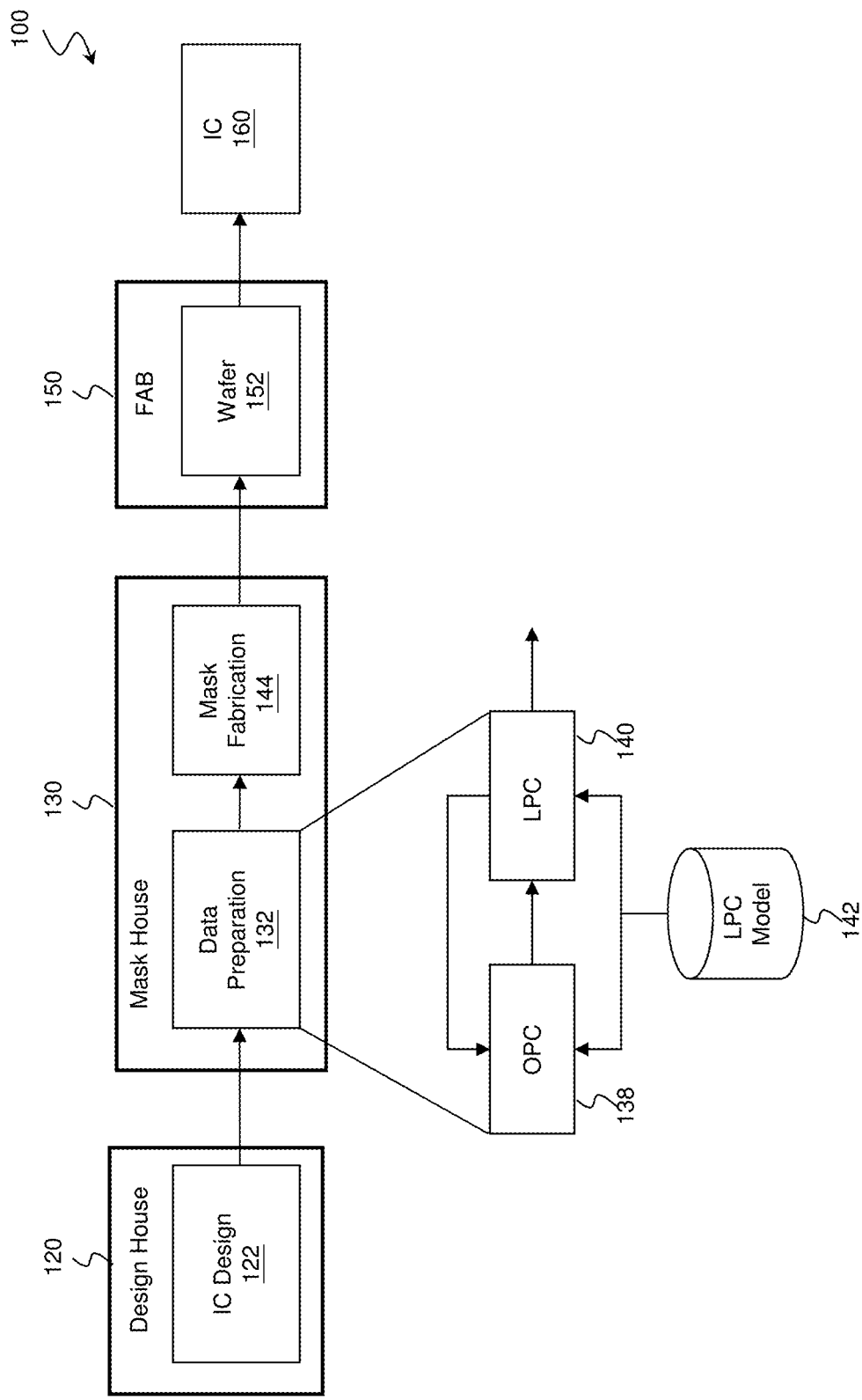
FIG. 1 is a simplified block diagram of an embodiment of an integrated circuit (IC) manufacturing system and an associated IC manufacturing flow.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 120, mask house 130, and IC manufacturer 150 may be a single entity or separate entities.

The design house (or design team) 120 generates an IC design layout 122. The IC design layout 122 includes various geometrical patterns designed for an IC product, based on a specification of the IC product to be manufactured. The geometrical patterns correspond to patterns of metal, oxide, or semiconductor layers that make up the various components of the IC device 160 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format (or DFII file format).

The mask house 130 uses the IC design layout 122 to manufacture one or more masks to be used for fabricating the various layers of the IC product according to the IC design layout 122. The mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the present embodiment, the mask data preparation 132 and mask fabrication 144 are illustrated as separate elements, however, the mask data preparation 132 and mask fabrication 144 can be collectively referred to as mask data preparation.

The mask data preparation 132 includes an optical proximity correction (OPC) 138, and a lithography process check (LPC) 140. The OPC 138 is a lithography enhancement technique used to compensate for image errors, such as those that can arise from diffraction, interference, or other process effects. OPC 138 may add features, such as scattering bars, serif, and/or hammerheads to the IC design layout 122 according to optical models or rules such that, after a lithography process, a final pattern on a wafer is improved with enhanced resolution and precision. The mask data preparation 132 according to the illustrated embodiment will be described in greater detail below. The mask data preparation 132 can include further resolution enhancement techniques, such as off-axis illumination, sub-resolution assist features, phase-shifting masks, other suitable techniques, or combinations thereof.

The LPC 140 simulates processing that will be implemented by the IC manufacturer 150 to fabricate the IC device 160. The LPC 140 simulates this processing based on the IC design layout 122 to create a simulated manufactured device, such as the IC device 160. The simulated manufactured device includes simulated contours of all or a portion of the IC design layout. In the present embodiment, the LPC 140 simulates processing of the modified IC design layout, which has been subjected to the OPC/or EPC 138. The LPC 140 uses one or more LPC models (or rules) 142. The LPC models (or rules) 142 may be based on actual processing parameters of the IC manufacturer 150. The processing parameters can include parameters associated with various processes of the IC manufacturing cycle, parameters associated with tools used for manufacturing the IC, and/or other aspects of the manufacturing process. LPC 140 takes into account various factors, such as aerial image contrast, depth of focus ("DOF"), mask error sensitivity ("MEEF"), other suitable factors, or combinations thereof.

After a simulated device has been created by the LPC 140, if the simulated device is not close enough in shape to satisfy design rules, certain steps in the mask data preparation 132, such as OPC 138, may be repeated to refine the IC design layout 122 further. It should be understood that the above description of the mask data preparation 132 has been simplified for the purposes of clarity, and data preparation may include additional features such as a logic operation (LOP) to modify the IC design layout according to manufacturing rules, a retarget process (RET) to modify the IC design layout to compensate for limitations in lithographic processes used by IC manufacturer 150, and a mask rule check (MRC) to modify the IC design layout to compensate for limitations during mask fabrication 144. Additionally, the processes applied to the IC design layout 122 during data preparation 132 may be executed in a variety of different orders.

After mask data preparation 132 and during mask fabrication 144, a mask or a group of masks are fabricated based on the modified IC design layout. For example, an electron-beam (e-beam) or a mechanism of multiple e-beams is used as an exposure source to form a pattern on a mask (photomask or reticle) based on the modified IC design layout. The mask fabrication 144 according to the illustrated embodiment will be described in greater detail below. The IC manufacturer 150 uses the mask (or masks) fabricated by the mask house 130 to fabricate the IC device 160.

Figure 2:
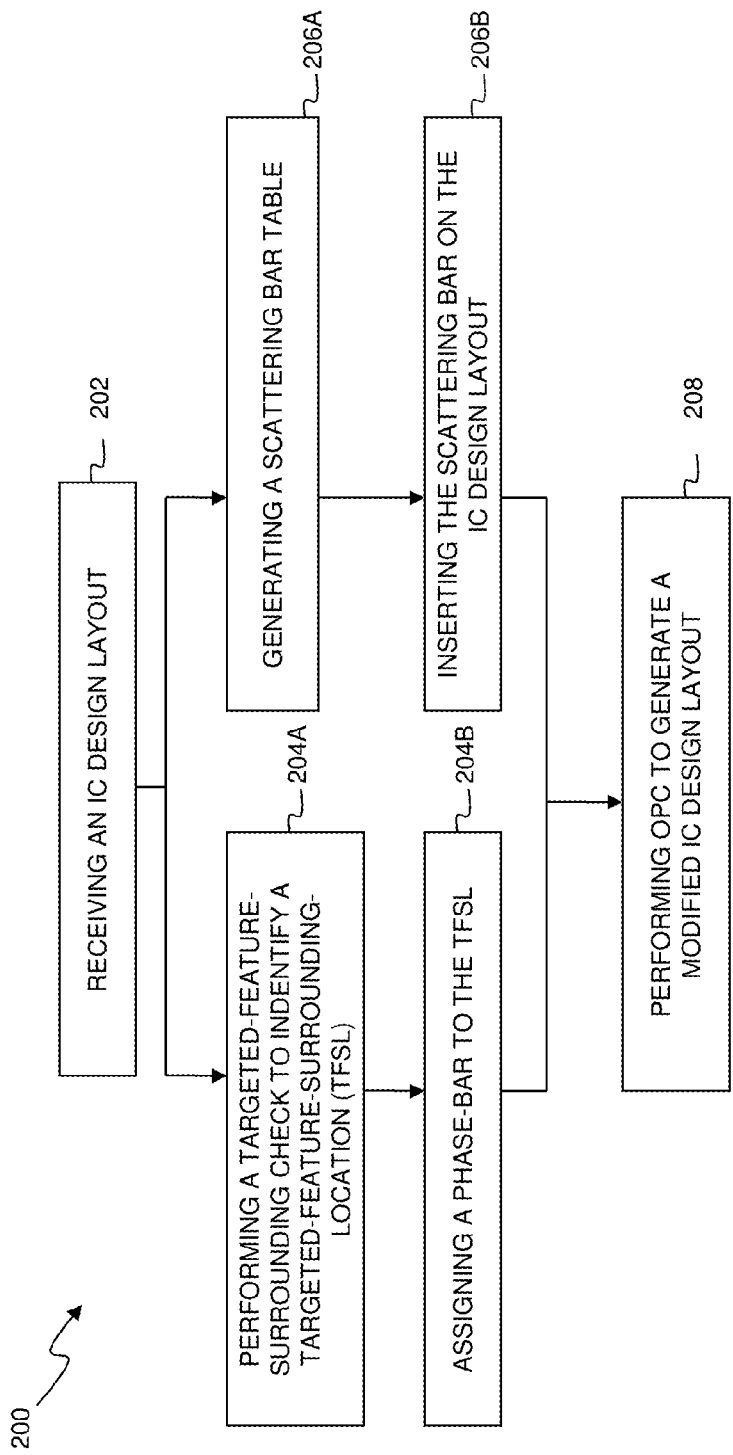
FIG. 2 is a flowchart of an example method of modifying an IC design layout before mask fabrication according to various aspects of the present disclosure.
Figure 3C:
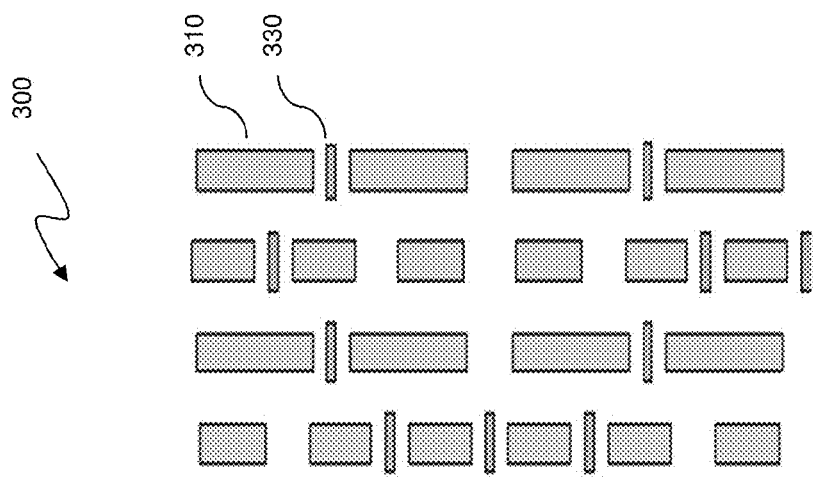
Figure 3B:
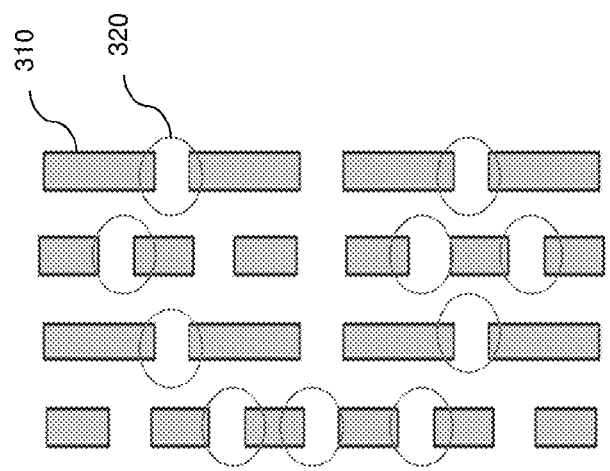
Figure 3A:
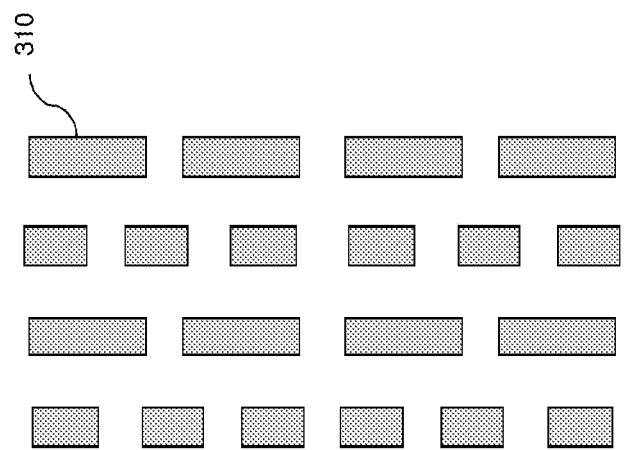

FIG. 2 is a flowchart of a method 200 of modifying an IC design layout before mask fabrication according to various aspects of the present disclosure. In one embodiment, the method 200 may be implemented in the mask data preparation 132 of mask house 130 shown in FIG. 1. Further, the method 200 in FIG. 2 is an overview and details associated with each step in the method will be described in association with the subsequent figures in the present disclosure.

Referring to FIGS. 2 and 3A-3C, the method 200 begins at step 202 by receiving an IC design layout 300. The IC design layout 300 is presented in one or more data files having the information of the geometrical patterns. In one example, the IC design layout 300 is expressed in a "GDS" format known in the art. In alternative embodiments, the IC design layout 300 may be transmitted between the components in IC manufacturing system 100 in alternate file formats such as DFII, CIF, OASIS, or any other suitable file type. The IC design layout 300 includes various geometrical patterns representing features of an integrated circuit. For example, the IC design layout 300 may includes main IC features 310 such as active regions, gate electrodes, sources and drains, metal lines, interlayer interconnection vias, and openings for bonding pads that may be formed in a semiconductor substrate (such as a silicon wafer) and various material layers disposed over the semiconductor substrate. The IC design layout 300 may also include certain assist features, such as those features for imaging effect, processing enhancement, and/or mask identification information.

The method 200 proceeds to steps 204A and 206A, in parallel. In step 204A, a targeted-feature-surrounding (TFS) checking operation is performed on the IC design layout 300. The TFS checking may be performed by using a rule-based approach to define a TFS location (TFSL) 320. In the rule-based approach, the TFSL 320 is identified by a list of feature-surrounding rules depending, for example, on the size of the IC feature 310, the spacing between adjacent IC feature 310 and its environment. For example, the TFSL 320 is identified by the rule of a minimum dimension between two IC features, such as line end to line end. The TFS checking is also performed by using a model-based approach to identify the TFSL 320. In the model-based approach, the TFSL 320 is identified by a model of IC pattern transferring process used to simulate a final image on a wafer. In one embodiment, the model includes a continuous phase map. TFSL 320 includes locations such as a line-end-to-line-end (LELE), a side-to-side of features, a side-to-end of features or/and any proper locations in the IC design layout 300.

The method 200 proceeds to a parallel step 206A by generating a rule-based scattering bar (SB) table, a model-based continuous-transmission map (CTM) or/and a model-based interference map (IM) on the IC design layout 300.

The method 200 proceeds to steps 204B and 206B, in parallel. In step 204B, a phase-bar (PB) 330 is assigned to the TFSL 320, which is obtained in step 204A. Each of the PB 330 is configured with predetermined phase-shift, shape and transmission for each of the TFSL 320. For example, the PB 330 is configured to have an about 180° phase-shift from the phase of an adjacent IC feature 310. For another example, the PB 330 is configured to have an about 90° phase-shift from the phase of an adjacent IC feature 310. The PB 330 is configured to have a transmission range from larger than zero to less than one. The PB 330 is configured to have a minimum dimension less than 2 times of the minimum pitch of the IC design layout 300.

Referring back to FIG. 2, the method 200 proceeds to a parallel step 206B by inserting SB to the IC design layout 300 according to the SB table, the CTM and the IM, which are obtained in the step 206A. Scattering bars are sub-resolution assist features (SRAF) that are placed on a mask (e.g., reticle or photo-mask) adjacent to isolated features and/or semi-isolated features, such as metal lines, trenches, or gate electrodes. The use of scattering bars enables these isolated and/or semi-isolated design features to form more like dense features.

The method 200 proceeds to step 208 by performing optical proximity correction (OPC) on the IC design layout 300 having the PB 330 and the SB and generating a modified IC design layout 400. In general, OPC is utilized to modify the shape of an IC feature to compensate for diffraction or other process effects so that the shape of the feature as formed in the final integrated circuit closely matches the shape of the feature in the IC design layout. As an example, by employing OPC on the IC design feature 310, a modified IC feature 410 is generated with various assist features, such as serifs and hammerheads, as shown in FIG. 4A. As another example, by employing OPC to the PB 330, a modified PB 430 is generated with various assist features, as shown in FIG. 4B.

The method 200 further includes performing a photolithography simulation and an error evaluation on the modified IC design layout 400 to form a final IC design layout 450 to be used in the mask fabrication 144, as being described in FIG. 1

Figure 5:
FIG. 5 is a flowchart of an example method of fabricating a photomask according to various aspects of the present disclosure.

FIG. 5 is a flowchart of a method 500 of fabricating a photomask of the final IC design layout 450 generated by the method 200 according to various aspects of the present disclosure. In one embodiment, the method 500 may be implemented in the mask fabrication 144 of mask house 130 shown in FIG. 1. Further, the method 500 in FIG. 5 is an overview and details associated with each step in the method will be described in association with the subsequent figures in the present disclosure.

In general, various masks are fabricated for being used in various processes. The mask can be a transmissive mask or a reflective mask. Types of masks include binary intensity mask (BIM) and phase-shifting mask (PSM). An example BIM includes an almost totally absorptive region (also referring to as an opaque region) and an absorber-absent region. In the opaque region, an absorber is present and an incident light beam is almost fully absorbed by the absorber. In the absorber-absent region, the absorber is removed and the incident light is transmitted/reflected through/by the mask. A PSM includes an absorptive region and an absorber-absent region. A portion of the incident light transmits/reflects from the absorptive region with a proper phase difference with respect to a light transmitted/reflected from the absorber-absent region to enhance the resolution and imaging quality. The PSM can be attenuated PSM (AttPSM) or alternating PSM (AltPSM).

Referring to FIGS. 5 and 6A, the method 500 begins at step 502 by receiving a blank mask 600, as shown in FIG. 6A. The blank mask 600 includes a substrate 610. The substrate 610 may include a low thermal expansion material (LTEM) glass, quartz, silicon, silicon carbide, black diamond, and/or other low thermal expansion substances known in the art.

Alternatively, for a reflective mask, the substrate 610 also includes a reflective multilayer (ML) deposited on the LTEM glass. The reflective ML is configured by a large number of alternating layers of materials having a high refractive index and a low refractive index. Pairing these two types of materials together provides a resonant reflectivity. The reflective ML includes a plurality of film pairs, such as molybdenum-silicon (Mo/Si) film pairs (e.g., a layer of molybdenum above or below a layer of silicon in each film pair). A typical number of film pairs is 20-80, however any number of film pairs is possible. An example of a reflective ML is described in U.S. Ser. No. 13/328,166 which is hereby incorporated by reference. Additionally, a capping layer is formed on the ML to prevent oxidation of the ML during a mask patterning process. The capping layer includes ruthenium (Ru), Ru compounds such as RuB and RuSi, silicon dioxide (SiO2), silicon nitride, aluminum oxide, amorphous carbon, or other suitable compositions.

The method 500 proceeds to step 504 by forming an absorption (an opaque) layer 620 over the substrate 610. The opaque layer 620 includes chromium, chromium oxide, aluminum-copper palladium, tantalum nitride, aluminum oxide titanium, tungsten, and/or combinations thereof. One or more of the layers ML and 620 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

The method 500 proceeds to step 506 by patterning the opaque layer 620 to form the design layout patterned EUV mask 700, as shown in FIG. 6B. In the present embodiment, the IC design layout includes the final IC design layout 450. A patterning process includes a photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other patterning processes such as maskless photolithography, electron-beam writing, direct-writing, and/or ion-beam writing.

An etching process is followed to etch the opaque layer 620 to form an absorber-absent region 630 and an opaque region 640, as shown in FIG. 6B. In the absorber-absent region 630, the opaque layer 620 is removed. In the opaque region 640, the opaque layer 620 remains. The opaque layer 620 may be removed by various methods, include a dry etch, a wet etch, or a combination of dry etch and wet etch. The dry etching process may implement by fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), oxygen-containing gas, iodine-containing gas, other suitable gases and/or plasmas, and/or combinations thereof. The etching process may include a multiple-step etching to gain etch selectivity, flexibility and desired etch profile.

The method 500 proceeds to step 508 by forming a phase-bar (PB) 650 in the absorber-absent region 630 according to the final IC design layout 450. In one embodiment, the PB 650 is formed as a trench type (referred to as PB trench) by removing a portion of the substrate 610. For example, the PB trench 650 is formed in a middle of the absorber-absent region 630, as shown in FIG. 7A. For another example, the PB trench 650 is formed between two opaque regions 640, as shown in FIG. 7B. For yet another example, the PB trench 650 is formed at both sides of the opaque region 640. The PB trench 650 may be formed by a suitable technique, such as focused-ion-beam etching or focused-electron-beam-induced etching. The depth (d) of the PB trench 650 is controlled to configure a predetermined phase-shift and transmission of the PB 650.

Figure 8A:
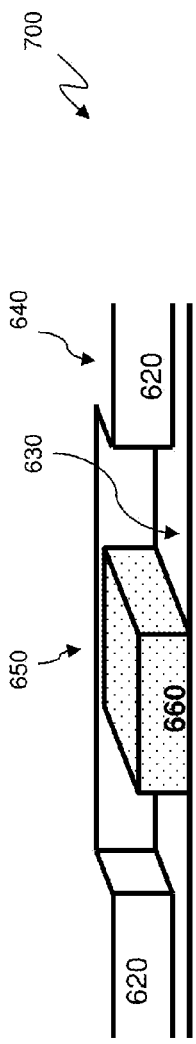
Figure 8B:
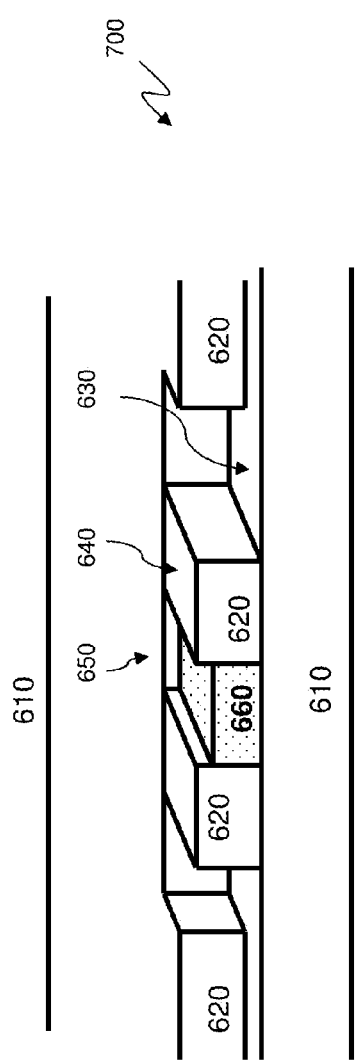
Figure 8C:
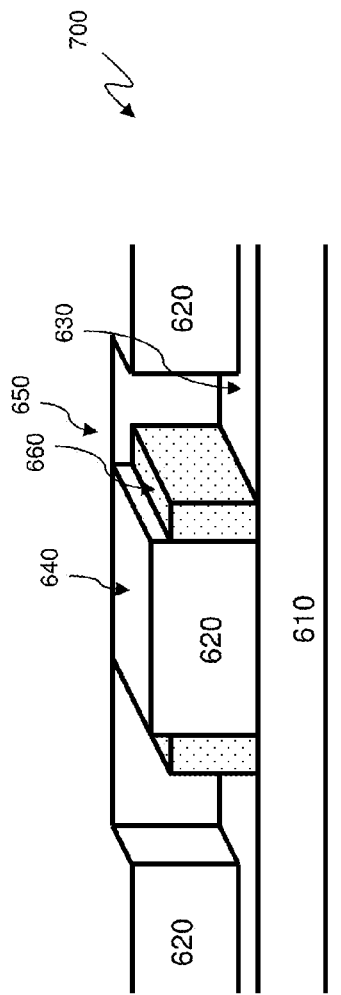

In another embodiment, the PB 650 is formed by depositing a PB material 660 in the absorber-absent 630 according to the final IC design 450. The PB material 660 is deposited locally in the substrate 610 by using gas-assisted focused-electron-beam-induced deposition, or any other suitable method. The PB material 660 includes molybdenum silicon oxide, aluminum nitride, silicon nitride, tantalum silicon oxide, tantalum nitride and tantalum boron nitride. In present embodiment, the PB material 660 is deposited locally at various locations in the absorber-absent 630. For example, the PB material 660 is deposited on a middle of the absorber-absent 630, as shown in FIG. 8A. For another example, the PB material 660 is deposited between two opaque regions 640, as shown in FIG. 8B. For yet another example, the PB material 660 is deposited at both sides of the opaque region 640, as shown in FIG. 8C. The thickness, refractive index and extinction coefficient of the PB material 660 are configured such that a predetermined phase-shift, transmission or both of them of the PB 650 are achieved. In one embodiment, the phase-shift of the PB 650 is configured to be about 180°. In another embodiment, the phase-shift of the PB 650 is configured to be about 90°. The transmission range of the PB 650 is configured to from larger than zero to less than one.

Based on the above, it can be seen that the present disclosure offers a method for modifying the original IC design layout by using the phase-bar (PB). The present disclosure also offers a method for making the PB in a photomask fabrication. The PB has a designable and flexible phase-shift, transmission and size. With a proper phase-shift and transmission, the use of the PB has demonstrated an enhancement of image contrast at the edge of the patterned IC feature, e.g. the line end, and achieved higher normalized image log slop (NILS).

The present disclosure provides many different embodiments of fabricating a semiconductor IC using a mask that provide one or more improvements over the prior art. In one embodiment, the mask is made by receiving an IC design layout having a plurality IC features, performing a targeted-feature-surrounding (TFS) checking to identify a targeted-feature-surrounding-location (TFSL) in the IC design layout, inserting a phase-bar (PB) to the TFSL, performing an optical proximity correction (OPC) to the IC design layout having the PB to form a modified IC design layout and providing the modified IC design layout for fabrication of the mask.

In another embodiment, a method for fabricating a photomask includes providing a substrate and an IC design layout having a phase-bar (PB), forming an absorption layer over the substrate, patterning the absorption layer to form an IC design layout pattern, wherein the patterned absorption layer including an opaque region and an absorber-absent region and forming a phase-bar (PB) in the absorber-absent region according to the IC design layout.

In yet another embodiment, a method for making a mask for an integrated circuit (IC) design includes receiving an IC design layout having a plurality IC features, performing a targeted-feature-surrounding (TFS) checking to identify a targeted-feature-surrounding-location (TFSL) in the IC design layout, coincident with performing the TFS checking, generating a scattering bar (SB) table for the IC design layout, inserting a phase bar (PB) to the TFSL in the IC design layout, inserting a SB on the IC design layout, performing an optical proximity correction (OPC) to the IC design layout having the PB and the SB to form a modified IC design layout and providing the modified IC design layout for fabrication of the mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a mask, comprising:
receiving an integrated circuit (IC) design layout;
performing a targeted-feature-surrounding (TFS) checking operation to identify a targeted-feature-surrounding-location (TFSL) in the IC design layout;
inserting a phase bar (PB) to the TFSL;
performing an optical proximity correction (OPC) to the IC design layout having the PB to form a modified IC design layout; and
fabricating the mask based on the modified IC design layout.

2. The method of claim 1, further comprising:
coincident with performing the TFS checking operation, generating a scattering bar (SB) table for the IC design layout; and
inserting a scattering bar (SB) in the IC design layout according to the SB table.

3. The method of claim 2, further comprising applying the OPC on the IC design layout having the PB and the SB.

4. The method of claim 1, wherein the TFSL includes a line-end-to-line-end (LELE) location.

5. The method of claim 1, wherein the TFSL is identified by a rule-based approach.

6. The method of claim 1, wherein the TFSL is identified by a model-based approach.

7. The method of claim 1, wherein the PB is designed to obtain a phase-shift from a phase of adjacent IC features in the IC design layout.

8. The method of claim 7, wherein the PB is designed to obtain 180° phase-shift.

9. The method of claim 7, wherein the PB is designed to obtain 90° phase-shift.

10. The method of claim 1, wherein the PB is designed to have a different transmission from adjacent IC features in the IC design layout.

11. The method of claim 1, wherein the PB is inserted into an IC design layout with minimum pitch.

12. A method of fabricating a mask, comprising:
providing a substrate;
providing an integrated circuit (IC) design layout having a phase-bar (PB);
forming an absorption layer over the substrate, wherein the mask includes the substrate and the absorption layer;
patterning the absorption layer to form an IC design layout pattern on the mask associated with the IC design layout therein, wherein the patterned absorption layer includes an opaque region and an absorber-absent region; and
forming the PB in the absorber-absent region according to the IC design layout.

13. The method of claim 12, wherein the PB is formed as a PB trench by removing a portion of the substrate in the absorber-absent region.

14. The method of claim 13, wherein a depth of the PB trench is controlled to obtain a predetermined phase-shift.

15. The method of claim 12, wherein the PB is formed by depositing a PB material locally in the absorber-absent region.

16. The method of claim 15, wherein the PB is formed with a predetermined phase-shift by configuring a thickness, a refractive index, and an extinction coefficient of the PB material.

17. The method of claim 16, wherein the predetermined phase-shift is 180°.

18. The method of claim 12, wherein the PB is formed to have a transmission range greater than zero and less than one.

19. The method of claim 12, wherein the PB includes a material from the group consisting of molybdenum silicon oxide, aluminum nitride, silicon nitride, tantalum silicon oxide, tantalum nitride, and tantalum boron nitride.

20. A method for making a mask, comprising:
receiving an integrated circuit (IC) design layout;

performing a targeted-feature-surrounding (TFS) checking operation to identify a targeted-feature-surrounding-location (TFSL) in the IC design layout;
coincident with performing the TFS checking operation, generating a scattering bar (SB) table for the IC design layout;
inserting a phase-bar (PB) to the TFSL in the IC design layout;
inserting a SB in the IC design layout;
performing an optical proximity correction (OPC) to the IC design layout having the PB and the SB to form a modified IC design layout; and
fabricating the mask based on the modified IC design layout.

* * * * *